(12) United States Patent
Dong et al.

(10) Patent No.: US 7,071,127 B2
(45) Date of Patent: Jul. 4, 2006

(54) METHODS FOR IMPROVING QUALITY OF SEMICONDUCTOR OXIDE COMPOSITION FORMED FROM HALOGEN-CONTAINING PRECURSOR

(75) Inventors: Zhong Dong, San Jose, CA (US); Chuck Jang, Fremont, CA (US); Chia-Shun Hsiao, Cupertino, CA (US)

(73) Assignee: ProMOS Technologies, Inc., Hsin-Chu (TW)

( * ) Notice: Subject to any disclaimer, the term of this patent is extended or adjusted under 35 U.S.C. 154(b) by 418 days.

(21) Appl. No.: 10/442,759

(22) Filed: May 20, 2003

(65) Prior Publication Data
US 2004/0235295 A1    Nov. 25, 2004

(51) Int. Cl.
*H01L 21/469*    (2006.01)
(52) U.S. Cl. .................. 438/787; 438/778; 438/765; 438/770; 438/788
(58) Field of Classification Search .............. None
See application file for complete search history.

(56) References Cited

U.S. PATENT DOCUMENTS

| | | | |
|---|---|---|---|
| 5,312,783 A | * | 5/1994 | Takasaki et al. ............ 438/785 |
| 6,218,315 B1 | | 4/2001 | Ballamine et al. |
| 6,461,982 B1 | | 10/2002 | DeBoer et al. |
| 6,509,283 B1 | | 1/2003 | Thomas |
| 6,537,461 B1 | | 3/2003 | Nakahara et al. |

* cited by examiner

*Primary Examiner*—Dung A. Le
(74) *Attorney, Agent, or Firm*—MacPherson Kwok Chen & Heid LLP; Gideon Gimlan

(57) ABSTRACT

A method and apparatus are disclosed for reducing the concentration of chlorine and/or other bound contaminants within a semiconductor oxide composition that is formed by chemical vapor deposition (CVD) using a semiconductor-element-providing reactant such as dichlorosilane (DCS) and an oxygen-providing reactant such as $N_2O$. In one embodiment, a DCS-HTO film is annealed by heating $N_2O$ gas to a temperature in the range of about 825° C. to about 950° C. so as to trigger exothermic decomposition of the $N_2O$ gas and flowing the heated gas across the DCS-HTO film so that disassociated atomic oxygen radicals within the heated $N_2O$ gas can transfer disassociating energy to chlorine atoms bound within the DCS-HTO film and so that the atomic oxygen radicals can fill oxygen vacancies within the semiconductor-oxide matrix of DCS-HTO film. An improved ONO structure may be formed with the annealed DCS-HTO film for use in floating gate or other memory applications.

11 Claims, 4 Drawing Sheets

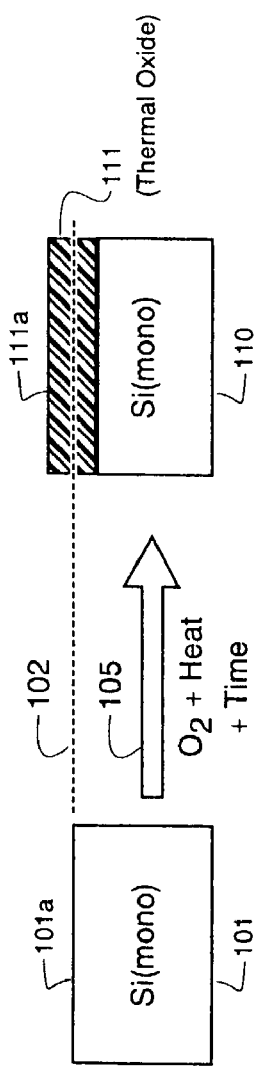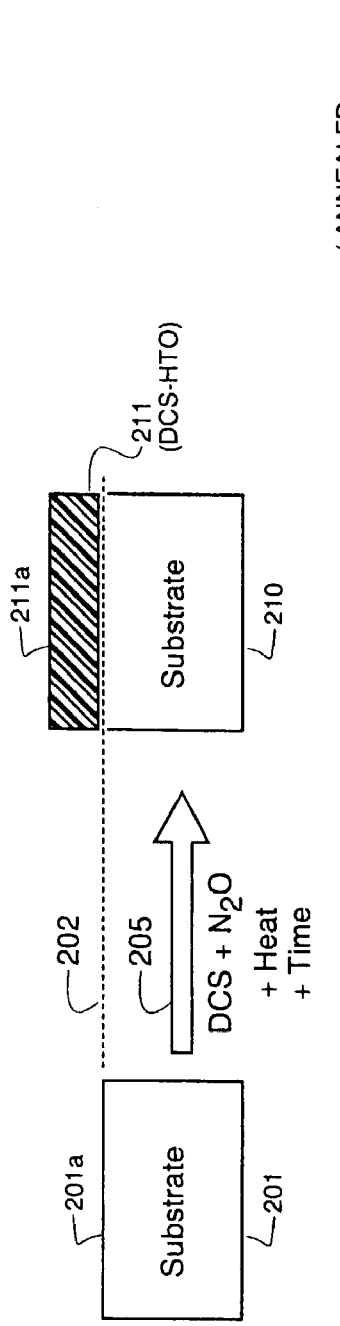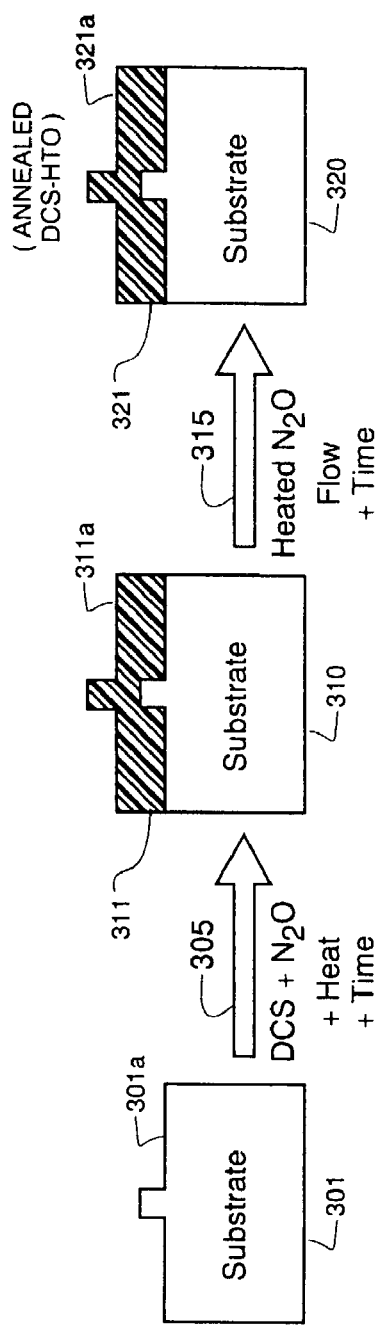
Fig. 1 (Prior Art) 100
Fig. 2 (Prior Art) 200
Fig. 3 300

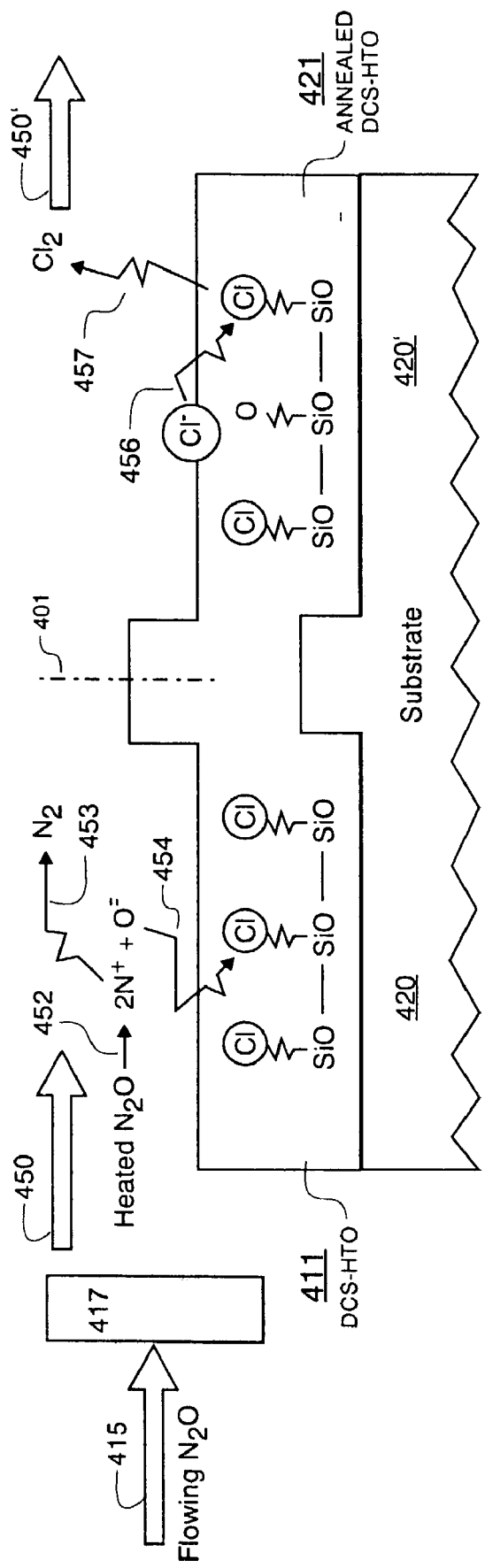

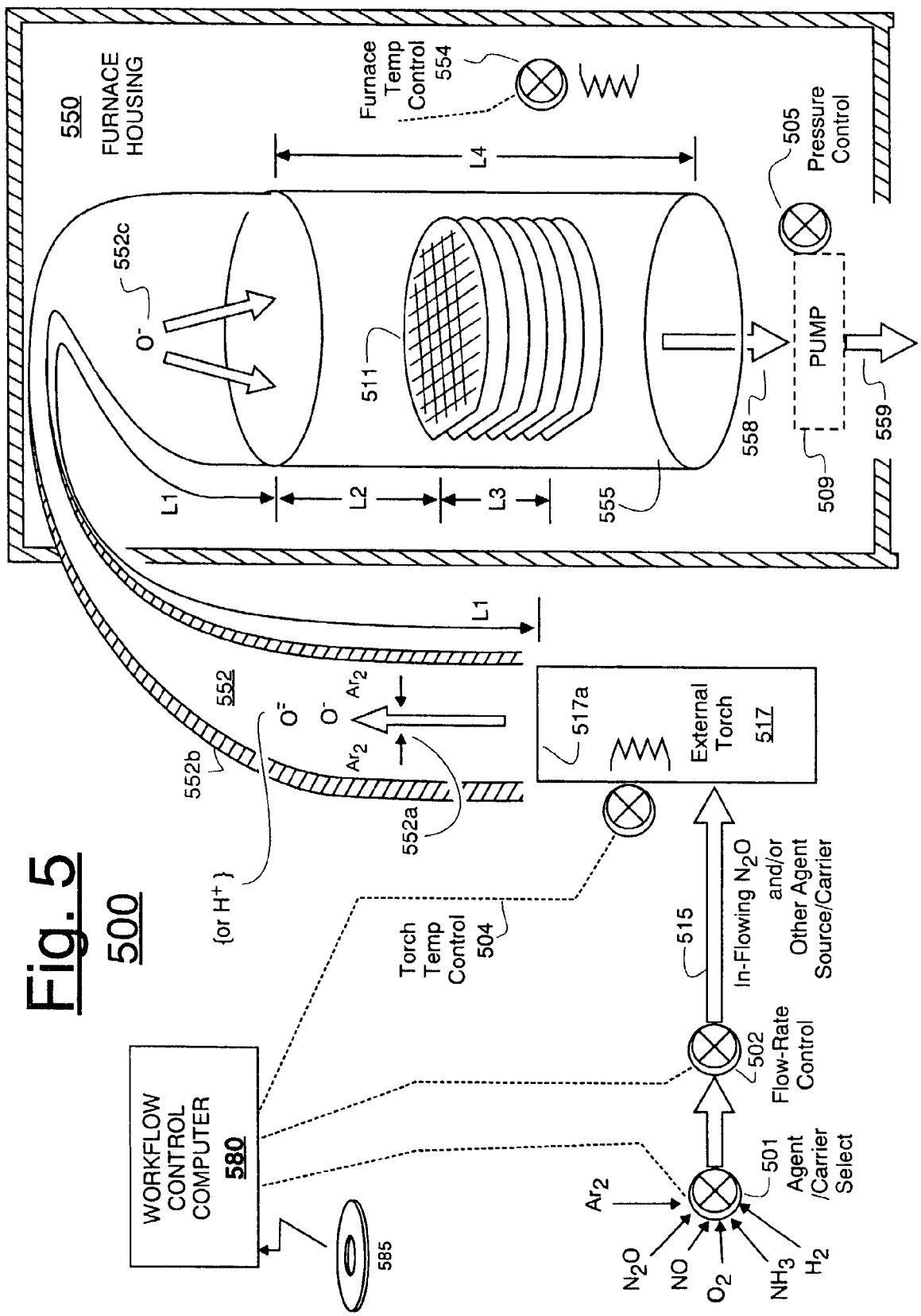

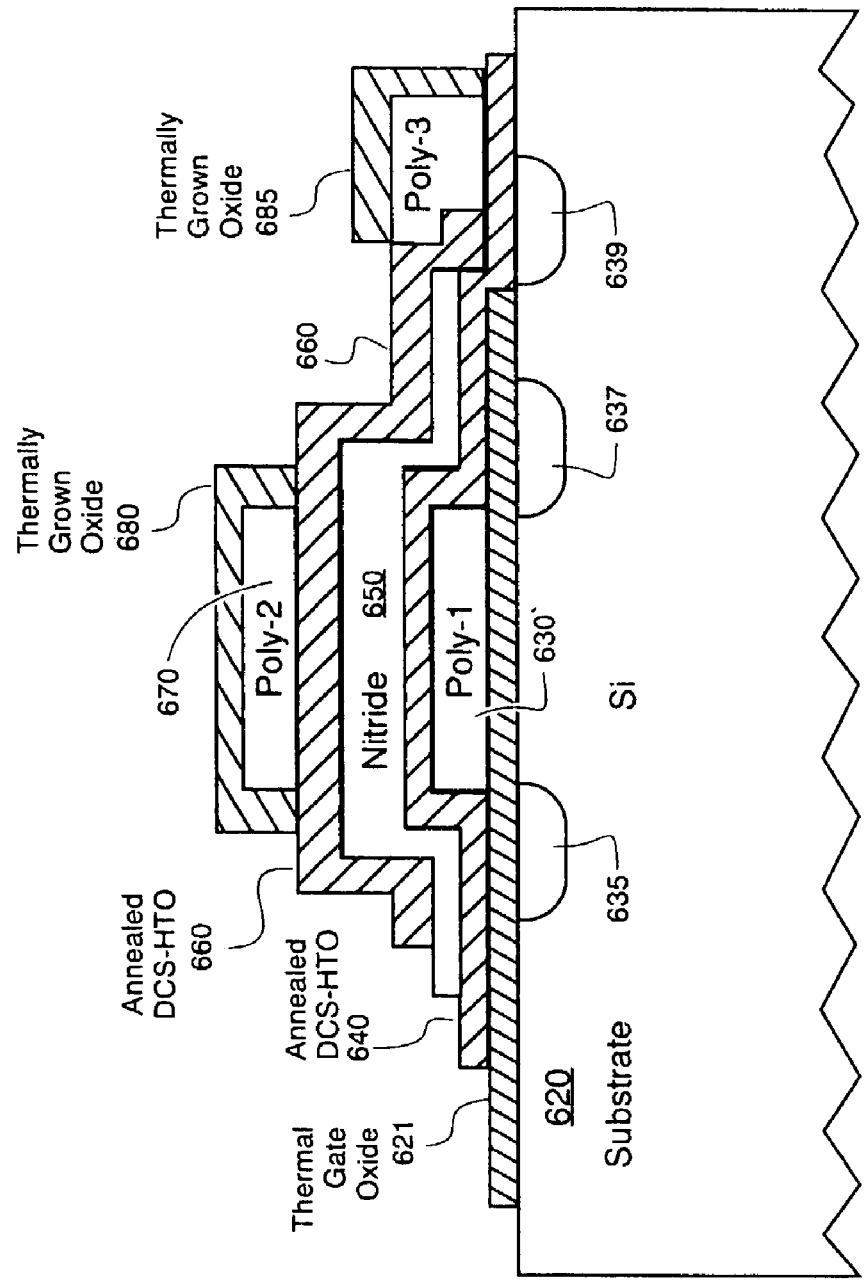

METHODS FOR IMPROVING QUALITY OF SEMICONDUCTOR OXIDE COMPOSITION FORMED FROM HALOGEN-CONTAINING PRECURSOR

1. FIELD OF DISCLOSURE

The present disclosure of invention relates generally to the formation of dielectric structures in semiconductor or other monolithically integrated devices.

The disclosure relates more specifically to the formation of oxide structures by way of chemical vapor deposition (CVD) techniques which use a halogen-containing precursor such as dichlorosilane ($SiH_2Cl_2$, also known as DCS) or the like.

2. CROSS REFERENCE TO PATENTS

The disclosures of the following U.S. patents are incorporated herein by reference:
(A) U.S. Pat. No. 6,218,315, issued Apr. 17, 2001 to Ballamine, et al. and entitled "HTO (High Temperature Oxide) Deposition for Capacitor Dielectrics".

3. DESCRIPTION OF RELATED ART

The use of batch thermal oxidation (oxide growth) to create a high quality, silicon dioxide layer ($SiO_2$) is well known in the art of semiconductor fabrication. Typically, batch thermal oxidation includes the step of exposing a batch of wafers, each having a monocrystalline surface layer of silicon (Si), to an oxygen-containing atmosphere at very high temperature (e.g., >1000° C.) and for a relatively long time (e.g., >20 minutes). Exposed silicon is consumed in each wafer and is converted into a relatively dense oxide which has relatively good electrical insulating properties and relatively good hermetic sealing properties (e.g., inhibiting oxygen punch-through).

Despite these advantageous properties, there are several drawbacks to the use of thermal growth for forming a silicon dioxide ($SiO_2$) region within a monolithic integrated circuit. First, expensively-formed monocrystalline silicon is consumed in the process and therefore the energy and effort that was expended into making the single crystal silicon is wasted to a certain extent. Second, the substrate surface that is to-be-covered by the silicon dioxide must be covered by an overlayer that is composed entirely of uniformly-formed single crystal silicon if a uniform oxide layer is desired. In cases where the to-be-covered surface has materials other than just monocrystalline Si, a different process generally has to be used. Third, the thermally grown oxide has a volume greater than that of the consumed silicon. The increase in volume can create unwanted stress, particularly if it occurs within a trench. Fourth, the relatively high temperatures and long growth times of thermal oxidation can disadvantageously eat away significant portions of the total thermal budget allowed for the device-under-fabrication. This may block the use of high temperature steps in subsequent fabrication operations.

One alternative to thermal oxidation is known as High Temperature Oxidation (HTO). The name is somewhat of a misnomer because HTO is often carried out rapidly and at temperatures that are substantially lower than those of thermal oxidation, thereby reducing the burden on the thermal budget of the device-under-fabrication. HTO is typically carried out as a chemical vapor deposition (CVD) process in which a silicon-containing reactant is combined at moderately high temperature (e.g., <1000° C.) and low pressure with an oxygen-containing reactant. One form of HTO that is of particular interest is DCS-HTO. For this form of HTO, Dichlorosilane ($SiH_2Cl_2$, also known as DCS) is combined with an oxygen-containing reactant such as nitrous oxide ($N_2O$) at a temperature of about 750° C. and a pressure less than 1 Torr to produce $SiO_2$. A typical reaction formula is per the following Eq. 1:

$$SiH_2Cl_2 + 2.N_2O \rightarrow SiO_2 + 2.HCl + 2.N_2 \qquad \{Eq. 1\}$$

Advantages of DCS-HTO include the elimination of the requirement that the to-be-covered substrate has to be covered by only monocrystalline silicon. Another advantage is that the DCS-HTO deposition process has a smaller impact on thermal budget than would a comparable thermal oxidation step. Yet another advantage is that pre-fabricated single crystal semiconductor does not have to be destroyed (consumed by the oxidation process).

Unfortunately, the conventional DCS-HTO process has many drawbacks of its own. The electrical insulating properties of the DCS-HTO oxide are relatively poor when compared to those of thermally-grown oxide. DCS-HTO films can have relatively large current leakages through them and low $Q_{bd}$ (charge to breakdown) thereby making them unattractive for use as electrical insulators in DRAM or other memory applications.

The hermetic sealing properties of DCS-HTO are also relatively poor when compared to those of thermal oxide. DCS-HTO oxide is fairly porous, meaning that oxygen and/or other reactants of subsequent process can leak through. The porosity of DCS-HTO oxide makes its use unattractive for forming sidewall structures that are to provide a sealing function.

Additionally, DCS-HTO oxide tends to have a relatively poor thickness uniformity (across the wafer) when compared to that of thermally-grown oxide. This nonuniformity is an additional factor that inhibits designers from using DCS-HTO for gate oxide or other applications where tight control over oxide thickness may be critical to proper device performance.

DCS-HTO oxide contains relatively large amounts of contaminant chlorine (Cl) and/or other contaminants. The contaminant chlorine in DCS-HTO can damage the underlying substrate. It can result in an undesirably high charge trapping density within an DCS-HTO film. Regions with excessive chlorine concentration can exhibit enhanced oxide growth rates. Oxide-induced stacking faults or other stress-related defects may be produced due to nonuniform density of the DCS-HTO. Severe bird's beak or punch-through oxidation may result due to the porous nature of DCS-HTO films. As a result, conventional DCS-HTO oxide is of limited utility.

INTRODUCTORY SUMMARY

Fabrication methods and resulting structures may be provided in accordance with the present disclosure of invention for improving over the above-described High Temperature Oxide (HTO) structures, where the latter are formed from halogen-containing precursors such as dichlorosilane ($SiH_2Cl_2$) or like precursors that have high concentrations of chlorine and/or equivalent contaminants.

More specifically, it is believed that the relatively high concentrations of chlorine and/or equivalent contaminants in DCS-HTO films (concentrations as high as about 10% atomic chlorine have been observed) are responsible for many of the drawbacks associated with DCS-HTO oxide. If some of the remnant chlorine and/or other contaminants can be selectively removed from the DCS-HTO-formed oxide without substantially reducing silicon and oxygen content, the electrically insulative and/or hermetic sealing properties of such DCS-HTO-formed oxide can be improved.

A method for selectively reducing the concentration of halogens and/or other contaminants from DCS or like types of High Temperature Oxidation (HTO) films may comprise the steps of: (a) generating energy-transferring radicals; (b) directing the energy-transferring radicals to the HTO-formed film so that the directed radicals can transfer disassociating energy to halogen (e.g., chlorine) and/or other contaminant particles within the HTO film; and (c) flowing disassociated ones of the halogen (e.g., chlorine) and/or other contaminant particles away from the HTO film.

In one embodiment, the energy-transferring radical is negatively charged atomic oxygen ($O^-$ and/or $O^{-2}$) which is obtained from and carried within a heated and flowing $N_2O$ gas stream where the flowing $N_2O$ gas is triggered into undergoing an exothermic decomposition reaction of the form:

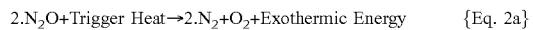  {Eq. 2a}

  {Eq. 2b}

(Note: the actual reaction may be more complex than merely this and other moieties may be generated due to trace contaminants and/or due to further recombinations of the available atoms. The high energy, hv radiation may radiate along the flow path to further generate free oxygen radicals downstream of the initial decomposition site.) The pre-triggered $N_2O$ gas stream has a temperature of about 900° C. and a pressure of less than about one atmosphere (<1 atm). Regions of the gas where the exothermic reaction occurs can develop a higher temperature. This greater amount of localized energy encourages the production of free oxygen radicals (equation Eq. 2b). If given sufficient time to do so, the free and more energetic radicals may simply recombine into $O_2$ molecules. However, travel time between the formation point of the energy-transferring radicals (e.g., $O^-$) and the to-be-treated, HTO film is made sufficiently short, the temperature of the surrounding atmosphere is kept sufficiently high (e.g., 900° C.) and the surrounding gas pressure is kept sufficiently low (e.g., <1 atm), so as to assure that an operative mean free path will exist for some of the energy-transferring radicals to reach and interact with the HTO film as opposed to simply letting the generated radicals re-associate with one another or with the carrier gas. In other words, the radical production system is arranged to give the $O^-$ radicals substantial opportunity to combine with the HTO film instead of combining with other oxygen atoms and simply forming lower-energy molecules such as, $O_2$ and/or $O_3$. Those of the highly-energized radicals (e.g., atomic oxygen, $O^-$) which reach the HTO film are believed to transfer disassociating energy either photonically or otherwise to bound contaminant atoms (e.g., chlorine). The transferred disassociating energy is believed to cause a disassociation of the bound contaminants from the HTO film. The disassociated contaminant atoms (e.g., chlorine) are believed to then combine with one another to form volatile $Cl_2$ gas and/or other contaminant-containing gas products that can easily outgas from the HTO film. The out-gassed, contaminant-containing products mix into the flowing-by $N_2O$ gas stream and move away from the HTO film to thereby leave behind an HTO film having a selectively reduced concentration of chlorine and/or other contaminant particles. At the same time, the de-energized atomic oxygen ($O^-$) which gave up its energy is believed to bind into the HTO film and to anneal it by filling oxygen vacancies in the $SiO_2$ matrix, thereby producing an oxide film of higher oxygen concentration and lower halogen concentration (e.g., lower chlorine concentration).

For one embodiment, the post-anneal HTO film has a chlorine concentration of less than 4000 $10^{10}$ atoms/$cm^2$ essentially throughout the film, and more particularly, less than 1000 $10^{10}$ atoms/$cm^2$, and yet more particularly, less than about 400 $10^{10}$ atoms/$cm^2$. For another embodiment, the post-anneal HTO film has a chlorine concentration of less than about 165 $10^{10}$ atoms/$cm^2$.

Device structures may be provided in accordance with the present disclosure of invention which were heretofore not practically attainable on a mass production basis. More specifically, in accordance with one aspect of the present disclosure, a floating gate structure is provided that comprises: (a) a first polysilicon gate electrode; (b) a thermal oxide layer disposed adjacent to a first side of the first polysilicon gate electrode; and (c) a first DCS-HTO layer disposed adjacent to a second side of the first polysilicon gate electrode, where the first DCS-HTO layer has a chlorine concentration of less than about 400 $10^{10}$ atoms/$cm^2$. In accordance with a further aspect of the present disclosure, the floating gate structure defines part of a multi-gate structure that further comprises: (d) a silicon nitride layer disposed adjacent to the first DCS-HTO layer; (e) a second DCS-HTO layer disposed adjacent to the silicon nitride layer, where the second DCS-HTO layer has a chlorine concentration of less than about 400 $10^{10}$ atoms/$cm^2$ and (f) a second polysilicon gate electrode disposed adjacent to the second DCS-HTO layer. Further in accordance with the disclosure, a post-anneal HTO film having a chlorine concentration of less than about 400 $10^{10}$ atoms/$cm^2$ may be used as a hermetic seal for inhibiting oxygen punch-through through the post-anneal HTO film.

Other aspects of the disclosure will become apparent from the below detailed description.

BRIEF DESCRIPTION OF THE DRAWINGS

The below detailed description section makes reference to the accompanying drawings, in which:

FIG. 1 is a schematic diagram depicting conventional formation of thermal silicon dioxide;

FIG. 2 is a schematic diagram depicting conventional formation of DCS-HTO;

FIG. 3 is a schematic diagram depicting formation of annealed DCS-HTO in accordance with this disclosure;

FIG. 4 is a schematic diagram depicting a possible mechanism for formation of annealed DCS-HTO in accordance with this disclosure;

FIG. 5 is a schematic diagram of an annealing apparatus which can be used for selectively removing halogen from an oxide composition and for thereby forming annealed DCS-HTO in accordance with this disclosure; and FIG. 6 is a cross sectional view of a semiconductor device which may be fabricated in accordance with this disclosure to include one or more annealed DCS-HTO sections.

DETAILED DESCRIPTION

FIG. 1 briefly shows a conventional process 100 for thermally growing silicon dioxide. In one embodiment, a monocrystalline silicon substrate 101 is provided with an exposed upper surface 101a. The exposed upper surface 101a is subjected to an oxygen-containing atmosphere and heat (105) for a predetermined amount of time. A portion of the substrate beneath the initial surface level 102 is converted into silicon dioxide 111. Because the volume of the oxide is greater than that of the consumed silicon, the upper surface 111a of the oxide is above initial level 102. Thermal oxidation may be carried out using polycrystalline silicon and/or amorphous silicon as the exposed initial surface (101a) and/or underlying substrate 101. The quality and/or thickness of the thermally grown oxide may vary due to differences in diffusion of oxygen through the poly or amorphous starting material as opposed more densely packed monocrystalline silicon.

FIG. 2 briefly shows a conventional process 200 for chemical vapor deposition (CVD) of silicon dioxide on a substrate. The substrate 201 may be made of a variety of materials. It is not limited merely to single crystal silicon (or polysilicon, or amorphous silicon if one of the latter is being used instead). Accordingly, the exposed surface 201a, which is positioned at level 202, may be composed of a variety of different sections made of different materials. In the deposition process 205, a halogen-containing source of silicon such as DCS is combined with nitrous oxide ($N_2O$) or another oxygen-donating reactant to provide a silicon oxide layer 211 disposed on substrate 210 as shown. Per the above discussion, the conventionally-formed DCS-HTO oxide (211) is relatively porous and has poor electrical qualities.

FIG. 3 schematically shows a process 300 in accordance with the present disclosure. Substrate 301, like substrate 201, may be composed of a number of different materials. It is not limited merely to silicon of a particular crystallinity. Upper surface 301a of this embodiment may be structured differently than surface 201a of FIG. 2 because the resultant oxide (321) will be less porous and will have better electrical qualities. The initial surface 301a of the substrate 301 may therefore be patterned with an expectation that a better-performing insulator (321) will be later formed thereon. In step 305, conventional DCS-HTO is formed as layer 311 by, for example, chemical vapor deposition where the reactants are DCS and $N_2O$.

In improvement step 315, the electrical characteristics and/or hermetic sealing characteristics of the oxide layer 311 are improved by flowing a heated gas containing freed radicals, such as $N_2O$ with freed oxygen radicals, across the original DCS-HTO oxide 311 for a predetermined amount of time. In one embodiment the temperature of the heated $N_2O$ is about 900° C. for triggering exothermic self-generation of the oxygen radicals, the flow rate of the to-be triggered $N_2O$ gas is about 3 liters per minute, its pressure is slightly below 1 atmosphere (<1 atm) and the treatment time is about 9 minutes for thereby defining a corresponding silicon oxide layer 321 of a thickness of about 50 Å.

A variety of modifications may be made to the HTO annealing process. The triggering temperature for initiating exothermic decomposition of the source $N_2O$ should be greater than 780° C. In one broader variation, the trigger temperature for the $N_2O$ is kept in the range 825° C.–950° C. In a narrower variation, the trigger temperature for the $N_2O$ input stream is kept in the range 875° C.–925° C. The input flow rate of the $N_2O$ gas may be varied over the range 1 liter per minute to 10 liters per minute. Higher flow rates tend to produce increased release of exothermic energy and increased temperature within the gas and shorter travel time for the freed radicals to reach the HTO film. The optimal flow rate for a given production run may have to be empirically determined because different shapes for the tubing that carries the energized gas and different organization of the wafers in the receiving chamber may produce different gas flow patterns and different results. The pressure of the in-flowing $N_2O$ gas may be varied over the range of about 1 Torr to 1 atmosphere. Higher pressures tend to result in more dense release of exothermic energy within the decomposing gas. However they also tend to increase the rate of recombination of the freed radicals. The optimal gas pressure rate for a given production run may have to be empirically determined because different shapes for the tubing that carries the energized gas and different organization of the wafers in the receiving chamber may produce different gas flow pressure patterns and different results. The anneal time may be varied over the range of about 5 minutes to 30 minutes. As indicated, the flow rate and pressure should be controlled to inhibit substantial re-association of atomic oxygen before it reaches the target HTO films as shall be detailed below.

The following TABLE 1A–1B shows elemental composition measurements made using W-source TXRF (Total Reflection X-Ray Fluoroscopy) and taken for an annealed DCS-HTO layer having a thickness of 50 Å and being formed by conventional DCS-HTO chemical vapor deposition followed by annealing for 9 minutes with an $N_2O$ stream heated to 900° C. and moving at an input rate of 3 liters per minute and a pressure of about 1 atmosphere. Three sampling points were used per wafer, with one being at the center of the wafer and the other two diagonally at ±X, ±Y locations indicated in millimeters (mm).

TABLE 1A–1B

DCS-HTO Oxide After Anneal ($N_2O$, 900° C., 9 minutes)

| Location | Contaminants | | | | | | | | | | | | | |
|---|---|---|---|---|---|---|---|---|---|---|---|---|---|---|
| | S | Cl | Ar | K | Ca | Ti | Cr | Mn | Fe | Co | Ni | Cu | Zn | I |
| Center | 180 ± 14 | 153 ± 11 | <10 | <20 | <5 | <1.0 | <0.6 | <0.5 | <0.4 | <0.3 | <0.3 | <0.3 | <0.4 | <1.3 |
| 50, −50 | 203 ± 15 | 130 ± 10 | <6 | <20 | <5 | <1.0 | <0.6 | <0.4 | <0.4 | <0.3 | <0.3 | <0.3 | <0.4 | <1.3 |
| −50, +50 | 220 ± 16 | 116 ± 9 | <8 | <20 | <5 | <1.1 | <0.6 | <0.4 | <0.4 | <0.3 | <0.3 | <0.3 | <0.4 | <1.4 |

(Notes for W-source TXRF measurements: Uncertainty values (±) are to 1σ deviation not including uncertainty from cross line interference. X-ray lines for elements in the Mo–Hf range may overlap with lines for elements in the S–Zn range. In other words, what is reported as sulfur (S) may theoretically be partly molybdenum (Mo).)

For purposes of comparison, the following TABLE 2A–2B shows X-ray contamination measurements similarly made for a similar DCS-HTO layer but without any annealing step following deposition.

TABLE 2A–2B

DCS-HTO Oxide Without Anneal (As Deposited)

| Location | S | Cl | Ar | K | Ca | Ti | Cr | Mn | ... |
|---|---|---|---|---|---|---|---|---|---|
| Center | 220* | 4600 ± 300 | ** | <20 | <5 | <1.5 | <0.5 | <0.3 | ... |
| 50, −50 | 350* | 6600 ± 400 | ** | <20 | <5 | <1.7 | <0.5 | <0.4 | ... |
| −50, +50 | 380* | 6600 ± 400 | ** | <20 | <5 | <1.6 | <0.5 | <0.4 | ... |

DCS-HTO Oxide Without Anneal

| Location | Mn | Fe | Co | Ni | Cu | Zn | I' |
|---|---|---|---|---|---|---|---|
| Center | <0.3 | 0.6 ± 0.1 | <0.19 | 0.4 ± 0.1 | <0.3 | <0.3 | 3 ± 0.6 |
| 50, −50 | <0.4 | 0.7 ± 0.2 | <0.3 | <0.3 | <0.3 | <0.4 | 3 ± 0.7 |
| −50, +50 | <0.4 | 1.0 ± 0.2 | <0.3 | 0.4 ± 0.1 | <0.3 | <0.4 | <2 |

(Notes for Table 2A–2B W-source TXRF measurements: *Intense Cl peaks makes exact quantification of S concentration (Sulfur) problematic. **Intense Cl peaks makes any quantification of Ar concentration (Argon) problematic.)

For further comparison purposes, the following TABLE 3 shows the contamination measurements for a reference silicon dioxide that is thermally grown on monocrystalline silicon using dry oxidation with TCA (1,1,1-trichloroethane).

off center) than those seen for the thermally grown oxide (Table 3A). By contrast, chlorine concentration for the non-annealed DCS-HTO (Table 2A) is order of magnitudes higher than each of the thermal oxide (Table 3A) and the $N_2O$ annealed oxide (Table 1A). Chlorine concentration in

TABLE 3A–3B

Thermal Oxide (Dry, with TCA)

| Location | S | Cl | Ar | K | Ca | Ti | Cr | Mn | Fe | Co | Ni | Cu | Zn | I |
|---|---|---|---|---|---|---|---|---|---|---|---|---|---|---|
| Center | 75 ± 7 | 140 ± 10 | 11 ± 2 | <20 | <5 | <0.8 | <0.8 | <0.5 | 0.9 ± 0.1 | <0.3 | <0.2 | <0.2 | <0.3 | <1.0 |
| 50, −50 | 127 ± 11 | 220 ± 14 | <6 | <20 | <5 | <1.2 | <0.5 | <0.4 | 0.6 ± 0.2 | <0.2 | <0.3 | <0.3 | 2.1 ± 0.2 | <1.2 |
| −50, +50 | 160 ± 13 | 224 ± 15 | <7 | <20 | <5 | <1.0 | <0.5 | <0.4 | 0.6 ± 0.2 | <0.3 | 0.6 ± 0.1 | <0.3 | <0.4 | <1.4 |

Aside from the experiments indicated above for $N_2O$ as the decomposition-source annealing gas, the inventors substituted NO as the decomposition-source annealing gas with the contamination results shown in the following TABLE 4A–4B. The temperature for the in-flowing NO was once again 900° C. but the treatment time was increased to 15 minutes.

the NO example (Table 4A) is somewhat greater than that observed for thermal oxide and the $N_2O$-annealed oxide but still order of magnitudes less than that of conventional DCS-HTO (Table 2A).

Referring to FIG. 4, a possible mechanism 400 which may be responsible for the observed results is depicted. At the left side of FIG. 4, flowing $N_2O$ gas 415 is shown entering an

TABLE 4A–4B

DCS-HTO Oxide After Anneal (N0, 900° C., 15 minutes)

| Location | S | Cl | Ar | K | Ca | Ti | Cr | Mn | Fe | Co | Ni | Cu | Zn | I |
|---|---|---|---|---|---|---|---|---|---|---|---|---|---|---|
| Center | 320 ± 20 | 330 ± 20 | <15 | <20 | <5 | <1.0 | <0.5 | <0.4 | <0.4 | <0.3 | <0.3 | <0.3 | <0.4 | <1.3 |
| 50, −50 | 300 ± 20 | 310 ± 20 | <8 | <20 | <5 | <1.0 | <0.5 | <0.4 | 0.5 ± 0.2 | <0.3 | <0.3 | 2 ± 0.2 | <0.4 | <1.3 |
| −50, +50 | 320 ± 20 | 380 ± 20 | <17 | <20 | <5 | <1.1 | <0.6 | <0.5 | 0.6 ± 0.2 | <0.3 | <0.3 | <0.3 | <0.4 | <1.3 |

It may be seen from the above results that the chlorine contamination numbers for the $N_2O$ annealed, DCS oxide (Table 1A) are roughly equal to, or even slightly less (when energizing means 417 such as an electric heating torch which transfers sufficient energy into the input gas 415 to induce exothermic decomposition and the production of energy-transferring radicals. In the illustrated case, the torch-heated $N_2O$ gas (450) decomposes exothermically and sporadically further disassociates (per reaction 452) into atomic oxygen ($O^-$ and/or $O^{-2}$) and molecular nitrogen ($N_2$). The molecular nitrogen ($N_2$) is relatively nonreactive, and mixes well with the carrier $N_2O$ gas 450, and is therefore pulled away by the passing flow 450 of $N_2O$ gas as is indicated by arrow 453. Contrastingly, the disassociated atomic oxygen ($O^-$ or $O^{-2}$) is highly reactive, it is small and can easily diffuse into the nearby oxide matrix 411 and, as is indicated by meandering path 454, the diassociated atomic oxygen can transfer its energy photonically or otherwise to a nearby bound chlorine atom within the DCS-HTO layer 411. The bound chlorine atom can then disassociate for possible interaction with nearby chlorine or other atoms. At the same time, the oxygen atom which has given up its energy, drops into a lower energy state by binding into the SiO complex. In doing so, it can fill an oxygen vacancy site within the SiO complex and improve the electrical insulating and/or hermetic sealing properties of the filled portion of the SiO complex.

The results of this interaction are shown to the right side of reference line 401. The energy-surrendering oxygen atom (O) is now shown bound into the SiO complex so as to fill an oxygen vacancy site within the SiO complex. On the other hand, the disassociated and now energized chlorine atom 456 moves about such that it can combine with yet another neighboring chlorine atom to form molecular chlorine ($Cl_2$). The molecular chlorine ($Cl_2$) outgases from the modified oxide layer 421 as is indicated by path 457 and the outgassed $Cl_2$ is then pulled away by the outflowing $N_2O$ carrier gas 450'. As a result, chlorine is selectively removed from the original DCS-HTO composition 411 and oxygen is added to fill oxygen vacancy sites and perfect or anneal the original DCS-HTO composition 411. Because the so-annealed HTO layer 421 (which is schematically depicted to the right side of reference line 401) now has a smaller concentration of chlorine atoms and a higher concentration of oxygen atoms, it is closer in composition and behavior to thermally grown silicon dioxide. It has better electrical insulating properties and better hermetic sealing properties (e.g., inhibiting oxygen punch-through) than did the original DCS-HTO composition 411. Benefits of this process are not limited to only the annealed HTO layer 421. The underlying substrate 420' may also benefit from this selective removal (457) of chlorine and insertion of oxygen for chlorine because the annealed oxide layer 421 may now place less lattice mismatch stress on underlying active areas composed of single crystal silicon (or of another appropriately crystalline semiconductor material).

Although FIG. 4 shows one conjectured mechanism 400 for explaining why a flowing stream of heated $N_2O$ gas (450) selectively removes chlorine and improves oxide quality, it is within the contemplation of this disclosure that other mechanisms may be involved. It is also within the contemplation of this disclosure to use other gases, in addition to or in place of $N_2O$ for generating disassociated and energized radicals which can diffuse (454) into the original CVD-HTO matrix 411 for interaction with, and selective removal of bound chlorine and/or other bound halogens and/or other bound contaminants (e.g., sulfur, iron, iodine) within the initial CVD-HTO matrix 411. More specifically, a comparison of Table 1A–B ($N_2O$-annealed HTO) with Table 2A–B (non-annealed HTO) shows that there is reduction of S (sulfur), Fe (iron) and I (iodine) concentration as well as the marked reduction in Cl (chlorine) concentration after the annealing process.

As proven by the experimental results of TABLE 4A–B, one alternate input gas is simply nitric oxide (NO). Alternatively, NO may be mixed with $N_2O$ to provide a mixed gas composition for providing exothermic decomposition and generating atomic oxygen 454 and carrying away released chlorine (457). Additionally or alternatively, molecular oxygen gas ($O_2$) may be mixed in with one or both of the exothermically-decomposing $N_2O$ and NO gases for thereby forming the oxygen-supplying input gas 415.

Alternatively, the energy transferring agents (radicals) which supply energy 454 for disassociating the bound contaminants (e.g., a halogen such as Cl or I) within the initial CVD-HTO matrix 411 may include atomic hydrogen ($H^+$). The source for such atomic hydrogen may be an inflowing carrier gas which includes $NH_3$ gas. The carrier gas may further include a mixture of $H_2$ and $N_2$ which may be heat-wise or otherwise triggered into undergoing an exothermic reaction that provides free atomic hydrogen radicals. Additionally the mixture of ammonia gas, hydrogen gas and/or nitrogen gas may be further mixed with an inert carrier gas such as Argon for forming an input gas 415 whose exothermic reaction rate is controlled by the amount of included inert gas.

Referring to FIG. 5, an apparatus 500 for carrying out selective removal of halogens and/or other contaminants from a dielectric layer is illustrated. Agent-selecting valve 501 picks one or more of possible source gases for generation of oxygen radicals such as $N_2O$, NO, and $O_2$; or for generation of hydrogen radicals such as $NH_3$ and $H_2$ and $N_2$ and/or for acting as an inert carrier (e.g., $Ar_2$) for carrying-in exothermally-freed radicals (e.g., 454) and/or for carrying away outgased contaminants (e.g., 457). The selected one or more source gases may be pumped through a flow-rate controlling means 502 which determines the flow rate of input gas in input tube 515.

Tube 515 feeds the source gas/gases into an upright external torch 517 whose chimney 517a feeds into a mostly upright, connecting tube 552. The external torch 517 is structured to heat the inflowing gas 515 to an appropriate temperature (e.g., in the range 800° C. to 1000° C., or more specifically, 825° C.–950° C.) which is selected to trigger exothermic decomposition of the inflowing source gas 515, particularly where the exothermic energy release occurs as the flowing gas moves away from the heating element of torch 517 reaches the chimney 517a. The exothermically released, energy of decomposition is used for generating energy transferring agents such as atomic oxygen or atomic hydrogen, particularly near the center 552a of the cross-sectional area of connecting tube 552, where temperature is greatest. Radiative energy (hv) may be generated at the initial site of exothermic reaction in the torch 517 and this radiative energy (hv) may be directed along the center flow region 552a of the mostly-upright connecting tube 552 so as to produce additional free radicals further downstream in the tube. The decomposition triggering temperature may be established by a first temperature control means 504 (e.g., a computer controlled temperature regulator) that is coupled to the torch 517. The triggering temperature may be varied together with gas flow rate so as to provide an appropriate balance between one or more of the following results: (1) avoid using excessively more energy than is needed for triggering the exothermic decomposition reaction; (2) adjust the rate at which atomic oxygen ($O^-$ and/or $O^{-2}$) or other free radicals are generated; (3) avoid over-energizing the carrier gas if any (e.g., N2O and/or Ar2) so that the thermal energy it carries exceeds a thermal budget that is predefined for the wafers 511 that are to be annealed. In one embodiment, the external torch 517 includes an electrically resistive heater element which electrically excited to heat the input gas 515 to the desired triggering temperature. The torch chimney is sized to fit into the interior diameter of the connecting tube 552 (or vise versa, the tube input diameter is sized to fit snugly over the outside of the chimney). Aside from heating the bulk of the inflowing gas 515, the production of atomic oxygen ($O^-$ and/or $O^{-2}$) or other free radicals in the central cross sectional part of the chimney outflow stream (552a), the energy for triggering the exothermic decomposition may be additionally realized by pumping RF energy into the chimney outflow 552a, subjecting the chimney outflow 552a to additional UV radiation or other forms of high energy radiation (hv), or by other appropriate means. The core temperature in the region of the exothermic decomposition is believed to be around 1050° C. to 1100° C. due to the extra energy provided by the exothermic decomposition of the agent source gas (e.g., $N_2O$). The core temperature in the chimney outflow 552a is believed to be slightly below about 1050° C. to 1100° C. due to minor energy loss downstream of the immediate site of the exothermic decomposition. A thermal insulating layer 552b should be provided around the torch chimney 517a and connecting tube 552 to limit loss of thermal energy to the ambient and thereby maintain the presence of the generated radicals.

Gas travel time between the output end 517a of the external torch 517 and the wafer stack 511 is important because the disassociated energy-transferring agents (e.g., $O^-$ and/or $O^{-2}$ or $H^+$) may undesirably recombine with one another in the transport tube 552 if travel time is too long and gas pressure is too high. In one embodiment, the transport tube 552 is composed of quartz and has a length L1 which is equal to or lesser than about 50 cm. One end of transport tube 552 is sized to snugly envelope the exhaust chimney 517a of the torch (approximately 1 cm–10 cm in diameter) and to extend linearly away from the torch chimney until reaching a bend area where it enters the furnace housing 550. (The linear extension allows hv radiation from the torch to easily reach further downstream in the flow and to thereby generate additional free radicals in the downstream region.) Although not fully shown in the drawing, the transport tube 552 increases monotonically in cross sectional diameter to prevent gas pressure from increasing within the tube and for thereby encouraging recombination of the free radicals in a higher pressured region. The other end of the transport tube 552 is sized (to approximately 1 cm–10 cm in diameter in one embodiment) so as to loosely envelope the top of a vertically-standing quartz boat 555. (Boat 555 may alternatively be tilted at a slight angle. The intent is to create a downdraft of free radicals 552c.) The quartz boat 555 may be a conventional one such as may be used for batch thermal oxidation. A batch of to-be-annealed wafers 511 (e.g., 10–25 wafers) is held in the boat 555, and in one embodiment, each of wafers 511 includes an exposed DCS-HTO surface area. Boat 555 is contained within a conventional furnace housing 550 that may be otherwise used for thermal oxidation or annealing. The furnace has its own independent, temperature control 554 for controlling temperature of gases within the furnace 550. In one embodiment, the bulk furnace temperature is set to about 900° C. as is the independent triggering temperature of the torch. A separate heating gas may envelope the outside of the quartz boat 555 as opposed to the chimney effluent 552c which flows through the interior of the boat. The gas exterior gas may also be composed of $N_2O$ or a mixture of $N_2O$ and $Ar_2$, or just of an inert gas such as Argon. Although further triggering of exothermic decomposition may be encouraged within the interior of the boat 555, the resulting high temperature can disadvantageously hurt the thermal budgets of the wafers 511. It is desirable to keep the core temperature within the boat 555 just below the decomposition triggering temperature. The availability of independent temperature controls, 504 and 554, respectively for the external torch 517 and for the interior of the furnace 550 gives operators (or computer 580) the ability to fine tune each of the respective temperatures so that free radicals are generated and maintained as they enter (552c) the boat 555 and so that a substantial amount of additional exothermic energy is not released immediately adjacent to the temperature sensitive wafers 511.

In one embodiment, the distance L2 between the top of the quartz boat 555 and the top of the wafer stack 511 is roughly 20–50 cm. The distance L3 spanned by the batch of wafers 511 is no more than about 80 cm. Thus the total distance from the chimney 517a of the external torch to the bottom of the stack 511 is approximately L1+L2+L3 and should be no more than roughly 160 cm for an input gas flow rate (502) of about 3 liters/minute. This design is used to assure that travel time between the external torch and the bottom most wafer in the stack is sufficiently short to avoid substantial recombination of the energy transferring agents (e.g. atomic oxygen and/or atomic hydrogen). As already explained thermal insulation 552b may be provided about the transport tube 552 for reducing heat loss. Gas pressure within tube 552 and within the interior 553 of the boat 555 should be kept relatively low in order to assure that there is a free mean path for the atomic oxygen or hydrogen to reach the bottom most wafer in the batch 511 and diffuse into its exposed DCS-HTO or other surface without suffering substantial recombination before hand. In one embodiment, an optional pump 509 is included within the exhaust system of the furnace housing 550 and the pump is controlled by an appropriate pressure control means 505 for keeping the pressure in the furnace housing at a desired level in the range 1 torr to 1 atmosphere. The exhaust gas 559 of the furnace housing 550 may be output to a gas scrubber (not shown) which cleans the exhaust gas for environmental purposes.

A control computer 580 may be provided within system 500 and operatively coupled to the various other parts of the annealing system 500 for receiving sensor signals from and/or sending control commands to electronically controllable parts the system, where the controllable parts may include one or more of elements 501, 502, 504, 505 and 554 as well as batch transfer tools (not shown) which are may be used for automatically moving annealed batches out of furnace 550 (after appropriate cool-down of their boats) and for moving new boats containing to-be-annealed new batches into the furnace 550 and into operative coupling with the transport tube 552. One or more computer programs 585 may be loaded into the control computer 580 from tangible computer media (e.g., CD-ROM disk) and/or from a communications network in the form of manufactured instructing signals so as to cause the computer 580 to carry out operations that support the methods described herein.

Referring to FIG. 6, a cross section is illustrated for a possible monolithically integrated circuit 600 which may be fabricated with the HTO annealing methods described herein. In the illustrated example 600, a monocrystalline silicon substrate 620 has a thermally-grown gate oxide layer 621 formed on at least part of its upper major surface. A first polysilicon layer (Poly-1) is deposited by CVD or other appropriate means on the gate oxide layer 621 and thereafter patterned to define, among other features, a first gate electrode 630. Dopants may be selectively implanted to define the conductivity type of the Poly-1 gate electrode (e.g., P type or N type) and to define transistor source or drain regions such as 635 and 637 in an active region just below the gate oxide. A first annealed DCS-HTO layer 640 may be formed in accordance with the annealing techniques described herein to define one or both of top and sidewall insulation regions for the Poly-1 gate electrode 630 and/or to cover the gate oxide layer 621 and/or to cover an exposed part (639) of the substrate.

The first annealed DCS-HTO layer 640 may be covered by a silicon nitride layer 650 that is deposited by conventional means. Subsequently, a second annealed DCS-HTO layer 660 may be formed in accordance with the conventional deposition and composition-enhancing anneal techniques described herein to define one or both of top and sidewall insulation regions for the Nitride layer 650 and/or to cover an exposed part (not shown) of the gate oxide layer 621 and/or to cover an exposed part of the first annealed DCS-HTO layer 640 (as shown above region 639). As a result of these steps, a stacked ONO structured may be defined by layers 640, 650 and 660.

The second annealed DCS-HTO layer 660 may be covered by a second polysilicon layer (Poly-2) which is deposited by CVD or other appropriate means on the ONO stack (640/650/660) and thereafter patterned to define, among other features, a second gate electrode 670 which is aligned over the first gate electrode 630 so as to define a stacked floating gate structure with ONO insulation protecting the floating gate 630. Dopants may be selectively implanted to define the conductivity type of the Poly-2 gate electrode (e.g., P type or N type) as desired.

An exposed outer surface portion of the Poly-2 gate electrode may be thermally oxidized to define insulation layer 680 as illustrated. If this is done, the annealed ONO structure 640/650/660 should be able to protect underlying structures (e.g., 630) from oxygen punch-through. Alternatively, layer 680 may be defined as a third annealed DCS-HTO layer which is formed in accordance with the conventional deposition and composition-enhancing anneal techniques described herein. Thereafter, the illustrated, third polysilicon layer (Poly-3) may be deposited, patterned and subsequently converted partially into insulation 685 by thermally oxidation. In this latter case, the third annealed DCS-HTO layer (680) should be able to protect underlying structures (e.g., 670) from oxygen punch-through.

The example 600 shown in FIG. 6 is merely illustrative of some uses to which an annealed DCS-HTO layer may be put if its composition is enhanced in accordance with the disclosure. Composition enhancement does not have to be uniform across an initial DCS-HTO layer. Some parts may be masked prior to annealing so as to provide regions of relatively increased and decreased porosity and/or better and worse insulation capabilities as may be desired for particular design goals. Moreover, a desired level of porosity and/or insulation may be obtained within a range having un-annealed DCS-HTO at one end and fully-annealed DCS-HTO at the other end by controlling anneal time, temperature and/or source gas as may be appropriate.

The present disclosure is to be taken as illustrative rather than as limiting the scope, nature, or spirit of the subject matter claimed below. Numerous modifications and variations will become apparent to those skilled in the art after studying the disclosure, including use of equivalent functional and/or structural substitutes for elements described herein, use of equivalent functional couplings for couplings described herein, and/or use of equivalent functional steps for steps described herein. Such insubstantial variations are to be considered within the scope of what is contemplated here. Moreover, if plural examples are given for specific means, or steps, and extrapolation between and/or beyond such given examples is obvious in view of the present disclosure, then the disclosure is to be deemed as effectively disclosing and thus covering at least such extrapolations.

By way of examples of further modifications in accordance with the disclosure, semiconductors other than silicon may form the bulk substrate of devices that contained annealed CVD-formed oxides in accordance with the present disclosure. The annealed CVD-formed oxides may be used in so-called, integrated MEM devices (Miniaturized Electro-Mechanical devices) and/or integrated optical devices.

Reservation of Extra-Patent Rights, Resolution of Conflicts, and Interpretation of Terms After this disclosure is lawfully published, the owner of the present patent application has no objection to the reproduction by others of textual and graphic materials contained herein provided such reproduction is for the limited purpose of understanding the present disclosure of invention and of thereby promoting the useful arts and sciences. The owner does not however disclaim any other rights that may be lawfully associated with the disclosed materials, including but not limited to, copyrights in any computer program listings or art works or other works provided herein, and to trademark or trade dress rights that may be associated with coined terms or art works provided herein and to other otherwise-protectable subject matter included herein or otherwise derivable herefrom.

If any disclosures are incorporated herein by reference and such incorporated disclosures conflict in part or whole with the present disclosure, then to the extent of conflict, and/or broader disclosure, and/or broader definition of terms, the present disclosure controls. If such incorporated disclosures conflict in part or whole with one another, then to the extent of conflict, the later-dated disclosure controls.

Unless expressly stated otherwise herein, ordinary terms have their corresponding ordinary meanings within the respective contexts of their presentations, and ordinary terms of art have their corresponding regular meanings within the relevant technical arts and within the respective contexts of their presentations herein.

Given the above disclosure of general concepts and specific embodiments, the scope of protection sought is to be defined by the claims appended hereto. The issued claims are not to be taken as limiting Applicant's right to claim disclosed, but not yet literally claimed subject matter by way of one or more further applications including those filed pursuant to 35 U.S.C. §120 and/or 35 U.S.C. §251.

What is claimed is:

1. A method for selectively reducing concentration of contaminant particles in a semiconductor oxide composition that is formed by chemical vapor deposition (CVD) using a semiconductor-element-providing reactant and an oxygen-providing reactant, where the contaminant particles in the semiconductor oxide composition are materials other than said semiconductor and other than oxygen, the reducing method comprising:

(a) generating energy-transferring radicals;

(b) flowing the energy-transferring radicals to the CVD-formed semiconductor oxide composition so that the flowed radicals can transfer disassociating energy to at least some contaminant particles in the semiconductor oxide composition, if any, and thereby cause disassociation of the at least some contaminant particles; and (c) flowing at least some of the disassociated contaminant particles away from the semiconductor oxide composition;
wherein said semiconductor-element-providing reactant includes dichlorosilane (DCS).

2. The contaminant reducing method of claim 1 wherein:
said semiconductor oxide composition includes silicon dioxide ($SiO_2$) and said contaminant particles include chlorine particles.

3. The contaminant reducing method of claim 1 wherein:
(a.1) said generating of energy-transferring radicals includes generating atomic oxygen.

4. The contaminant reducing method of claim 1 wherein:
(a.1) said generating of energy-transferring radicals includes energizing a flowing carrier gas having molecules that contain at least one element that is converted into a corresponding one of said energy-transferring radicals.

5. The contaminant reducing method of claim 4 wherein:
(a.2) said carrier gas includes nitrous oxide ($N_2O$).

6. The contaminant reducing method of claim 4 wherein:
(a.3) said energizing of the flowing carrier gas includes heating the carrier gas to a temperature in the range of about 825° C. to about 950°C. so as to trigger exothermic decomposition of a component of the carrier gas.

7. The contaminant reducing method of claim 4 wherein:
(a.3) said energizing of the flowing carrier gas includes heating the carrier gas to a temperature in the range of about 875° C. to about 925°C.

8. The contaminant reducing method of claim 1 wherein said step (a) of generating energy-transferring radicals and said step of (b) flowing the energy-transferring radicals are preceded by:
(d) supplying a carrier gas to a gas energizer at a flow rate in the range of about 1 liter per minute to 10 liters per minute where the supplied carrier gas contains at least one element that is converted into a corresponding one of said energy-transferring radicals and said gas energizer increases energy within said supplied carrier gas sufficiently to disassociate said at least one element.

9. A method for annealing a semiconductor oxide composition that is formed by chemical vapor deposition (CVD) using a semiconductor-element-providing reactant and an oxygen-providing reactant, where the semiconductor oxide composition includes one or both of oxygen vacancy sites and one or more halogen contaminants, the annealing method comprising:
(a) supplying a flowing stream of carrier gas where the supplied carrier gas contains oxygen;
(b) heating the flowing stream of carrier gas to a temperature in the range of about 825°C. to about 950° C.;
(C) directing the heated carrier gas to one or more workpieces having exposed surfaces containing said CVD-formed semiconductor oxide composition; and
(d) continuing said steps (a), (b) and (C) for at least about 5 minutes;
(a. 1) wherein said carrier gas includes at least one of nitrous oxide ($N_2O$), nitric oxide (NO), molecular oxygen ($O_2$), molecular hydrogen ($H_2$), and ammonia ($NH_3$); and
(c. 1) wherein said CVD-formed semiconductor oxide composition is formed with a semiconductor-element-providing reactant that includes dichlorosilane (DCS).

10. The annealing method of claim 9 and further comprising:
(e) stopping at least one of said steps (b) and (C) after the one or more workpieces have been subjected to the heated carrier gas for a time period of no more than about 30 minutes.

11. The annealing method of claim 9 wherein:
(a.1) said flowing stream of carrier gas flows at a rate in the range of about 1 liter per minute to 10 liters per minute.

* * * * *